United States Patent
Zhang et al.

(10) Patent No.: US 10,262,744 B2
(45) Date of Patent: Apr. 16, 2019

(54) LAYER-BASED MEMORY CONTROLLER OPTIMIZATIONS FOR THREE DIMENSIONAL MEMORY CONSTRUCTS

(71) Applicant: SK Hynix Inc., Gyeonggi-do (KR)

(72) Inventors: Fan Zhang, Fremont, CA (US); Yu Cai, San Jose, CA (US); Chenrong Xiong, San Jose, CA (US); Aman Bhatia, San Jose, CA (US); HyungSeok Kim, Santa Clara, CA (US); David Pignatelli, Saratoga, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/589,863

(22) Filed: May 8, 2017

(65) Prior Publication Data

US 2018/0047453 A1 Feb. 15, 2018

Related U.S. Application Data

(60) Provisional application No. 62/373,883, filed on Aug. 11, 2016.

(51) Int. Cl.
| | | |
|---|---|---|
| *G11C 16/28* | (2006.01) | |
| *G11C 16/04* | (2006.01) | |
| *G11C 16/10* | (2006.01) | |
| *G11C 5/02* | (2006.01) | |
| *G11C 7/18* | (2006.01) | |
| *G11C 16/34* | (2006.01) | |
| *G11C 29/02* | (2006.01) | |

(52) U.S. Cl.
CPC ............ *G11C 16/28* (2013.01); *G11C 5/025* (2013.01); *G11C 7/18* (2013.01); *G11C 16/0483* (2013.01); *G11C 16/10* (2013.01); *G11C 16/3495* (2013.01); *G11C 29/021* (2013.01); *G11C 29/028* (2013.01)

(58) Field of Classification Search
CPC ....................................................... G11C 16/10
USPC .................................................... 365/185.18
See application file for complete search history.

(56) References Cited

U.S. PATENT DOCUMENTS

| | | | |
|---|---|---|---|
| 6,906,371 B2 | 6/2005 | Ma et al. | |
| 7,903,468 B2 | 3/2011 | Litsyn et al. | |
| 8,054,681 B2 | 11/2011 | Pan et al. | |
| 8,077,520 B1 | 12/2011 | Yang et al. | |
| 8,365,030 B1* | 1/2013 | Choi | G06F 11/1048 |
| | | | 714/746 |
| 9,042,169 B2 | 5/2015 | Sridharan et al. | |
| 2011/0051527 A1* | 3/2011 | Kirisawa | G11C 16/0483 |
| | | | 365/185.29 |
| 2011/0199833 A1* | 8/2011 | Shim | G11C 16/0483 |
| | | | 365/185.23 |
| 2014/0362641 A1* | 12/2014 | Dong | G11C 11/5642 |
| | | | 365/185.17 |

(Continued)

*Primary Examiner* — Min Huang
(74) *Attorney, Agent, or Firm* — Kilpatrick Townsend & Stockton LLP

(57) ABSTRACT

Disclosed are techniques for selecting one or more reference voltages for performing one or more operations on a memory cell based on a determined layer of a three-dimensional memory construct to which the memory cell belongs. The one or more operations can include read or write operations. The memory cell can be a flash memory cell.

20 Claims, 10 Drawing Sheets

(56) References Cited

U.S. PATENT DOCUMENTS

2015/0049551 A1* 2/2015 Sawamura ............. G11C 16/06
　　　　　　　　　　　　　　　　　　　　365/185.17
2016/0233224 A1* 8/2016 Rhie ................. H01L 27/11582

* cited by examiner

LAYER-BASED MEMORY CONTROLLER OPTIMIZATIONS FOR THREE DIMENSIONAL MEMORY CONSTRUCTS

CROSS-REFERENCES TO RELATED APPLICATIONS

The present application claims priority to U.S. Provisional Application No. 62/373,883, entitled "WL GROUPING FOR HARD READ THRESHOLD OPTIMIZATION," filed Aug. 11, 2016, which is commonly assigned and expressly incorporated by reference herein in its entirety for all purposes.

BACKGROUND OF THE INVENTION

Solid-state memory is ubiquitously used in a variety of electronic systems including, for example, consumer electronic devices (e.g., cellular phones, cameras, computers, etc.) and in enterprise computing systems (e.g., hard drives, random access memory (RAM), etc.). Solid-state memory has gained popularity over mechanical or other memory storage techniques due to latency, throughput, shock resistance, packaging, and other considerations. Cost is one consideration for enabling widespread adoption of solid-state memory for production and/or adoption. Advanced manufacturing technologies including smaller lithographies, use of multi-state cells, and three-dimensional memory constructs have reduced prices of solid-state memory. However, these advanced manufacturing techniques can result in undesirable effects to other attributes of solid-state memory. For example, reliability or speed may suffer as a consequence of increasingly dense manufacturing techniques. Thus, there is need for improvement in the field of solid state memory.

BRIEF SUMMARY OF THE INVENTION

Disclosed herein are techniques to improve accuracy and reliability of memory operations performed using three-dimensional memory constructs. The increased accuracy and reliability can be used in regard to, for example, determining a state of one or more memory cells of a three-dimensional memory construct. By improving the accuracy of such read operations, speeds of solid state memory can be improved by, for example, mitigating use of unnecessary additional read operations which may consume system resources and/or reduce reliability of solid state memory, improving longevity of the memory cells.

As used herein, the term three-dimensional memory means that the memory is manufactured using deposition techniques wherein memory cell(s) are deposited/stacked in sequential layers. For example, the memory cell(s) may be arranged in planar arrays that are arranged in stack(s). The stack(s) can be formed by sequentially forming the planar arrays one atop another. Examples of memory that may be formed into three dimensional constructs include flash memory (e.g., NAND, NOR, single-level cell (SLC), multi-level cell (MLC), triple-level cell (TLC)), crosspoint memory, phase change memory, ferroelectric memory, magneto resistive memory, etc.

Three dimensional memory constructs have been developed to, for example, increase densities of memory devices and/or circuit dies as compared to two-dimensional (planar) constructs. However, three-dimensional memory construction techniques may introduce a variety of inconsistencies into the memory due to, for example, manufacturing inconsistencies or relatively complex trace routing to accommodate the increased density of three dimensional memory constructs. These inconsistencies can impact memory operations by, for example, reducing accuracy or reliability of read or write operations. Techniques disclosed herein can be used to account for inconsistencies in three-dimensional memory constructs and ultimately to mitigate undesirable impacts to memory operation(s) using three-dimensional memory constructs.

In certain embodiments, techniques are disclosed to account for inconsistencies between layers of a three-dimensional memory construct. The techniques can be used to adaptively recognize and/or account for manufacturing imperfections of a three dimensional memory construct. The techniques can adaptively select voltage(s), current(s), or other criteria for accessing specific memory cell(s) in a memory construct based on layer(s) that the memory cell(s) are disposed within.

Disclosed are techniques including memory comprising planar arrays of memory cells, wherein the planar arrays are arranged in stacked layers, each layer comprising a respective one of the planar arrays. The techniques can include use of a controller coupled to the memory. The controller can be configured to select one of the memory cells to perform an operation on. The control can also be configured to determine which one of the layers the one of the memory cells is disposed within. The controller can additionally be configured to select, based on the one of the layers that the one of the memory cells is disposed within, a reference voltage for use in performing the operation. The controller can also be configured to perform the operation using the reference voltage selected for the one of the layers.

The controller can be configured to select the reference voltage from one of several discrete reference voltages stored on the device. The several discrete voltages can be one of several groups of discrete voltages, each of the groups of discrete voltages corresponding to a respective one of groups of the memory cells. Each of the groups of memory cells can include memory cells within a same circuit die. Each of the several discrete reference voltages can correspond to a subset of the layers. The operation can be a read operation that can include comparing a voltage read from the one of the memory cells to a threshold voltage based on the reference voltage; or applying, based on the reference voltage, a voltage to the memory cell to read a value stored therein.

The reference voltage can be selected based on one or more conditions including at least one of a retention time of data stored within the one of the memory cells or a number of program erase cycles that the one of the memory cells has been subjected to. The operation can be a write operation including selecting a voltage to write to the one of the memory cells based on the reference voltage. Each of the layers can correspond to a respective wordline. The one of the layers can be determined based on the wordline that the one of the memory cells corresponds to. The reference voltage can be selected based on one or more conditions of the memory cell. The one or more conditions can include at least one of a retention time of data stored within the one of the memory cells or a number of program erase cycles that the one of the memory cells has been subjected to.

The controller can further be configured to select the reference voltage from a set of one or more discrete reference voltages, the set selected from several sets based on the one or more conditions. The memory cells can be flash memory cells. The plurality of layers can be manufactured using deposition techniques wherein each of the plurality of layers is deposited sequentially. The memory cells can each be configured to store three or more discrete states, each of the three or more discrete states corresponding to a value stored by the corresponding memory cell. The operation can be a read operation to determine if the memory cell is in one of three or more discrete states. The controller can be configured to select the reference voltage from one of several discrete reference voltages based upon the one of the three or more discrete states.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Figure 1A:
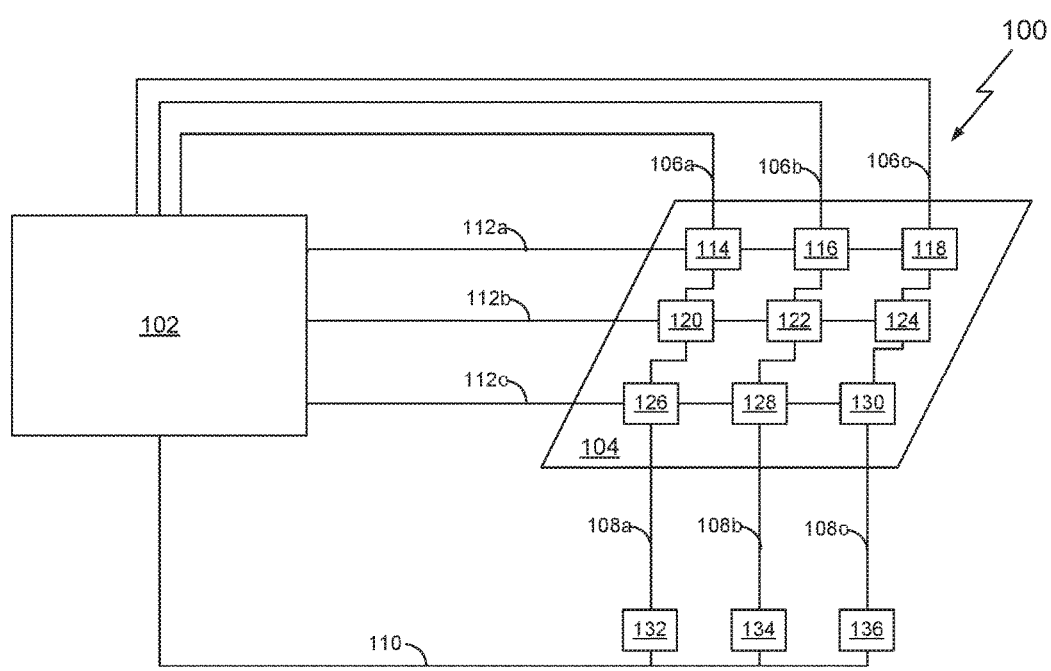
FIG. 1A illustrates a simplified block diagram of a planar memory construct.

FIG. 1A illustrates a system 100 including a planar memory construct 104. Planar memory construct 104 can be a two-dimensional memory construct that may be manufactured using deposition techniques. As illustrated, controller 102 can interface with planar memory construct 104. Controller 102 can be configured to determine (i.e., read) state(s) of one or more memory cells 114-130 of planar memory construct 104. Controller 102 and planar memory construct 104 can, for example, be integrated into a device (such as a solid state hard drive). Controller 102 can be configured to write to one or more of memory cells 114-130. The read and write operations can be performed in parallel and in any combination. Although not illustrated, controller 102 can interface with a central processing unit (CPU) via a bus (e.g., a peripheral component interface (PCI)). Controller 102 can include processor(s) (x86, ARM, etc.), buffer(s), driver(s), programmable logic device(s), an application specific integrated circuit (ASIC), etc. Controller 102 can interface with memory (not shown) to load and/or implement firmware or other instructions that, when executed by controller 102, can configure controller 102 to provide an interface between planar memory construct 104 and external device(s).

Planar memory construct 104 can include, for example, flash memory. In order to determine a value stored by a flash memory cell, controller 102 can induce a voltage on the memory cell (e.g., either by generating a voltage or commanding a voltage to be generated). If the flash memory cell conducts after the voltage is applied, controller 102 may determine that the flash memory cell stores a value. As a simple example, a conducting state of a flash memory cell can indicate that the memory cell stores a logic 1. If the memory cell does not conduct upon application of a voltage, then controller 102 may determine that the memory cell stores a logic 0. Certain flash memory cells can be used to store one of several states. For example, a flash memory cell may store 3, 4, 8, or other numbers of states. As one example, a flash memory cell can conduct when a certain threshold voltage is applied. For example, a 0.5V threshold may correspond to a second state out of eight. In the example, the flash memory cell storing the second state may conduct if 0.5V or more is applied to the memory cell. Similarly, a 0.8V threshold may correspond to a third state out of the eight example states. As such, the flash memory cell storing the third state may conduct when 0.8V or more is applied to the flash memory cell.

Controller 102 can be configured to apply voltage(s) sequentially, for example, to determine state(s) of flash memory cells. For example, Controller 102 may sequentially apply increasing voltages via a digital-to-analog converter and/or command a digital-to-analog converter coupled to the flash memory cells to generate sequentially increasing voltages. Controller 102 can also determine at what voltage(s) certain memory cell(s) conduct as the voltage(s) are increased to determine state(s) of memory cell(s). The applied voltage(s) to determine a state of a memory cell can be referred to as reference voltages. Although 0.5V and 0.8V are provided as two example threshold voltages to determine a state of a memory cell, these thresholds may not be static for all memory cells. For example, given a layer that the memory cell is disposed within or various conditions of the memory cells, the thresholds may drift or otherwise differ. If reference voltages are not changed, then differing threshold voltages may cause errors if, for example, a constant reference voltage is applied to memory cells having differing threshold voltages (e.g., a reference voltage of 0.6 volts being applied to determine a state of a first memory cell having a 0.5V threshold for a state and a second memory cell having a 0.7V threshold for the same state). Thus, selection of proper reference voltages for specific memory cells can mitigate errors resulting from differing threshold voltages between memory cells.

Addressability of memory cells within a memory construct (e.g., planar memory construct 104) can become cumbersome as, for example, when a number of memory cells disposed within planar memory construct 104 is increased. For example, one control schema to address each of memory cells 114-130 may be to provide a corresponding unique control line between controller 102 and each of memory cells 114-130. However, such a schema may result in an unnecessary multitude of traces, drivers, senses, etc. As illustrated, row and column addressing can be used to determine a value of a specific memory cell of planar memory construct 104. For example, control lines 106a-c and 110 can be used as column drivers (which may also be referred to as bitlines). Control line 110 can be a common ground. When control line 106a is driven, a voltage may be applied to memory cells 114, 120, and 126. Similarly, memory cells 116, 122, and 128 may be energized by control line 106b and memory cells 118 124, and 130 can be energized by control line 106c. Control lines 112a-112c can be considered row drivers (or wordlines). When control line 112a is energized, memory cells 114, 116, and 118 may be energized. Likewise, control line 112b can correspond to and energize memory cells 120, 122, and 124 and control line 112c can correspond to and energize memory cells 126, 128, and 130.

Sense amplifiers 132, 134, and 136 can be connected to respective memory cells via control lines 108a-108c. As an example use case, controller 102 may perform a read operation to determine a state of memory cell 120. As such, controller 102 may sequentially provide one or more threshold voltages (as disclosed herein regarding multi-state memory cells) to determine a state of memory cell 120. If memory cell 120 is a flash memory cell and conducts corresponding to one of the one or more threshold voltages, the state of memory cell 120 can be determined by applying various voltages to memory cell 120. However, as illustrated, memory cells 114 and 126 may be in series with memory cell 120 along control line (bitline) 106a. In order to prevent memory cells 114 and 126 from interfering with the read operation of memory cell 120, control lines (wordlines) 112a and 112c may be energized with a voltage selected to ensure that memory cells 114 and 126 conduct regardless of values stored therein. Such a voltage can be referred to as a pass-through voltage. In such a manner, the state of memory cell 120 can be determined for only memory cell 120 by sense amplifier 132 even though memory cells 126 and 114 may be electrically in series with memory cell 120 between control line 106a and sense amplifier 132.

In certain embodiments, an integrated circuit (or an integrated circuit die) can comprise controller 102 and a separate integrated circuit (or an integrated circuit die) can comprise memory construct 104. In certain embodiments memory construct 104 can be included in an integrated circuit including sense amplifiers 132-136 and/or voltage generators used to drive various control lines (e.g., control lines 106a-c and/or 112a-c). For example, controller 102 may be included in an integrated circuit that may be coupled to an integrated circuit comprising memory construct 104 via a digital interface. The digital interface may command voltage generators included in the integrated circuit comprising memory construct 104 to generate voltage to drive control lines contained therein. For example, the voltage generators can be digital-to-analog converters. Similarly, feedback from sense amplifiers 132-136 can be communicated to controller 102 via a digital interface coupling two integrated circuits.

Figure 1B:
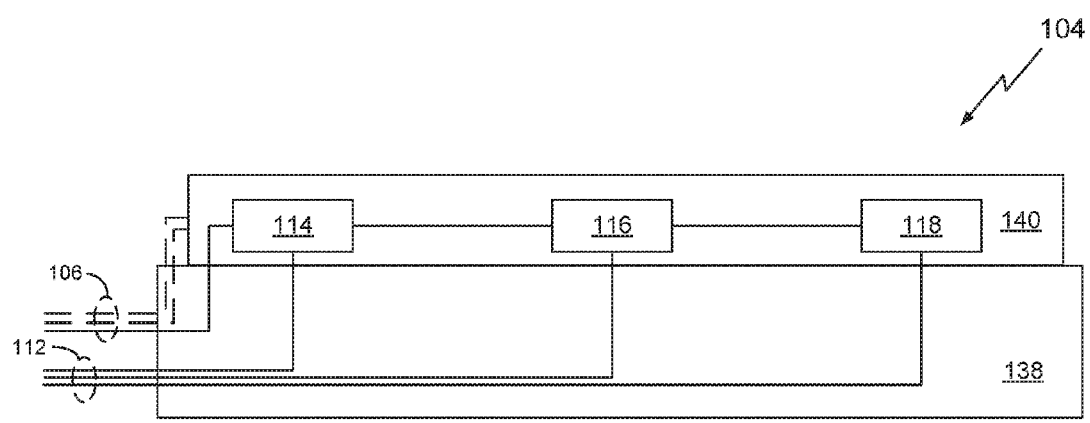
FIG. 1B illustrates a cross-sectional view of the memory construct of FIG. 1A.
Figure 2A:
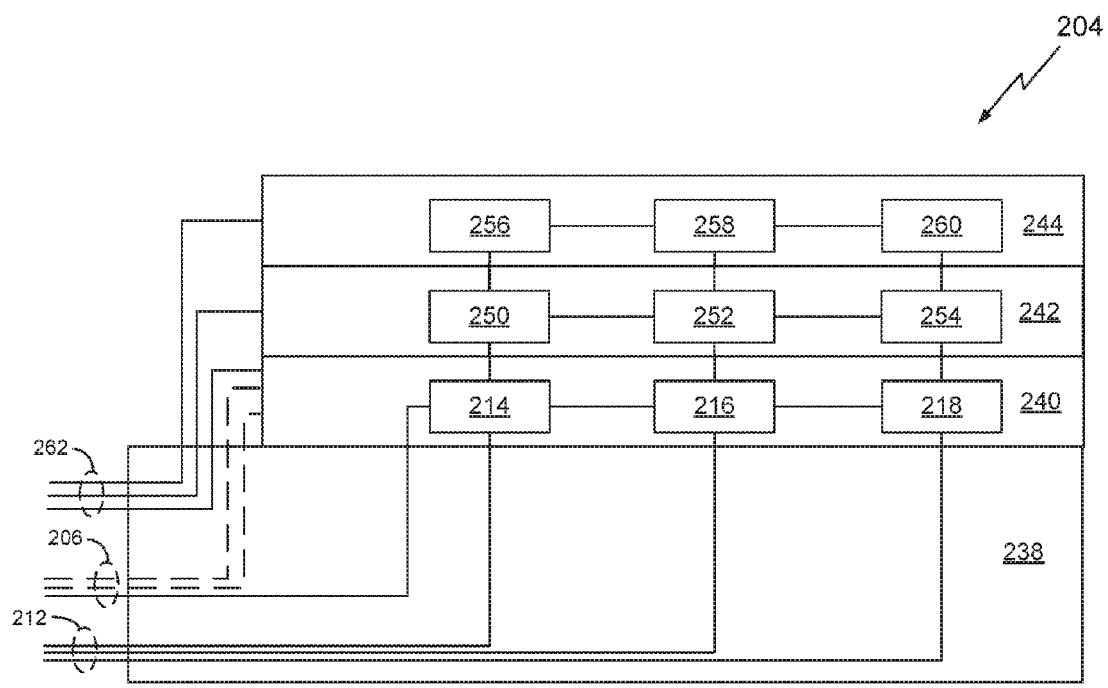
FIG. 2A illustrates a cross-sectional view of a three-dimensional memory construct.
Figure 2B:
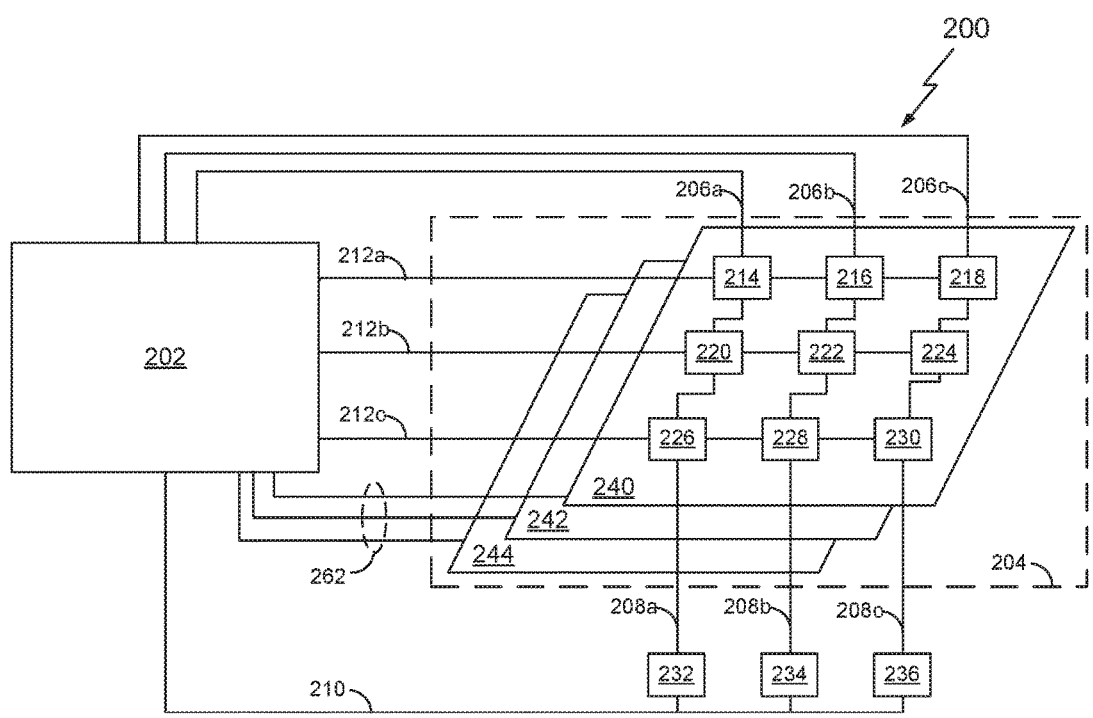
FIG. 2B illustrates a simplified block diagram of the three-dimensional memory construct of FIG. 2A.

FIG. 1B illustrates a cross-sectional view of planar memory construct 104. Planar memory construct 104 can be included within an integrated circuit die or package. FIG. 1B is provided for ease of understanding of terminology and differences between two-dimensional memory (as illustrated in FIGS. 1A and 1B) and three-dimensional memory (as illustrated in FIGS. 2A and 2B). As illustrated, memory cells 114, 116, and 118 can be disposed within a layer 140 of planar memory construct 104. Layer 140 can be manufactured on top of substrate 138. Layer 140 can be formed by sequentially depositing or etching material onto substrate 138. Furthermore, various traces 106 and 112 can be manufactured into planar memory construct 104 to accommodate respective control lines 106a-106c and 112a-112c, for example.

FIG. 2A illustrates a cross-sectional view of three-dimensional memory construct 204. Three-dimensional memory construct 204 can be similar in operation to planar memory construct 104. However, three-dimensional memory construct 204 may include multiple layers 240, 242, and 244 which can each include corresponding memory cells (214-218, 250-254, and 256-260). Furthermore, routing of control lines can become more cumbersome due to the increased number of memory cells within a same package. For example, in three-dimensional memory construct 204, three separate sets of control traces (212, 206, and 262) may be used to address a specific memory cell within the construct. Control traces 212, 206, and 262 can be routed through substrate 238. Therefore, in addition to row and column control lines (bitlines and wordlines), a tertiary set of control lines (select lines) may be needed to address a specific memory cell due to the additional dimension of three-dimensional memory construct 204 over planar memory construct 104. In certain embodiments, a tertiary set of control lines may not be utilized by a three-dimensional memory construct. For example, a layer of a three-dimensional construct may correspond to a page of the other subset of memory cells to be read from the memory construct. In certain embodiments, a wordline may select a layer of a three-dimensional layer construct.

It should be understood that routing of control lines between memory cells in a three-dimensional memory construct can be non-trivial due to space constraints. Memory devices may be manufactured using miniscule lithographies (14 nm, 10 nm, or 7 nm, for example). Although these decreasing lithography feature sizes can increase densities of memory cells and traces, process variations can become increasingly pronounced. For example, a variation of 1 nm becomes more pronounced as lithgographic feature sizes decrease. As increasing numbers of layers of memory cells are used to manufacture memory constructs, the process variations can stack and/or increase variability between layers. Thus, process variations increasingly contribute to electrical differences between memory cells in three-dimensional memory constructs. Furthermore, the traces that connect the memory cells are also subject to the same process variations. Thus, impedances to each of the memory cells can also become increasingly more variable as three-dimensional memory constructs become more dense, include more layers, etc. Memory cells in differing layers may demonstrate electrical differences due to impedance differences, control light routing, or other differences with a three-dimensional memory construct.

FIG. 2B illustrates a system 200 including three-dimensional memory construct 204. System 200 operates similarly to system 100, but includes additional complexity to account for additional layers of three-dimensional memory construct 204 over planar memory construct 104. Controller 202 can be similar to controller 102 and sense amplifiers 232-236 can be similar to sense amplifiers 132-136. Memory cells 214-230 can be similar to memory cells 114-130.

Each of layers 240, 242, and 244 can individually be functionally equated to planar memory construct 104. However, as disclosed herein, three-dimensional memory construct 204 may include an additional set of control lines 262 to enable addressing of an appropriate layer (240, 242, or 244) of memory cells. In other words, one of control lines 206a-206c, 212a-212c and one of 262 can be energized to address one of the memory cells of three-dimensional memory construct 204. For example, memory cells 214-230 are disposed within layer 240. Each of layers 242-244 may also include memory cells (not illustrated). Energizing one of control lines 262 can energize a corresponding set of memory cells (for example, a set including one memory cell from each of layers 240, 242, and 244).

System 200 is just one example of a system used to address individual cells within a three-dimensional memory construct. It should be understood that the memory cells of a three-dimensional memory construct (or a two-dimensional memory construct) can be arranged in a variety of manners. For example, a control line (such as a wordline, bitline, select line, or other) may energize an entire layer of a three-dimensional memory construct. A control line can energize a set of memory cells within a layer or memory cells disposed in several layers in any combination. The techniques disclosed herein can be applied to three-dimensional memory constructs regardless of the configuration of control lines to memory cells.

Figure 3:
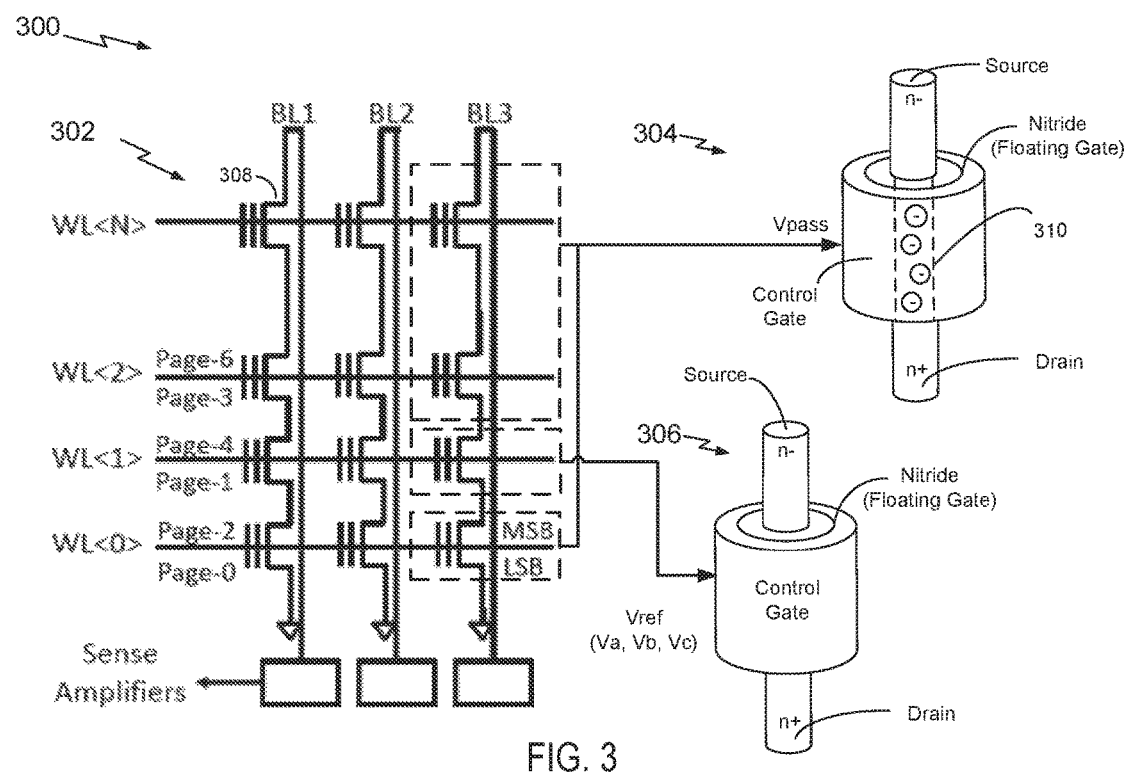
FIG. 3 includes various diagrams of memory constructs according to certain embodiments.

FIG. 3 illustrates several different views of memory constructs 300. Diagram 302 includes a notional arrangement of memory cells that can correspond to features of FIGS. 1A-2B. For example, BL1-BL3 of diagram 302 can be bitlines that can correspond to control lines 106a-106c. WL<0> through WL<N> can be wordlines that can correspond to control lines 112a-112c. The sense amplifiers can correspond to sense amplifiers 132-136. The transistors, such as transistor 308, can each correspond to one of planar memory cells 104. Each of the transistors can store multiple values as a corresponding analog voltage. For example, each of the memory cells can store one of four values and may be represented as a two bit value (e.g., 0b00, 0b01, 0b10, or 0b11). Thus, data stored within memory cells can be represented by corresponding least significant bits (LSBs) and most significant bits (MSBs). The LSBs and MSBs of a wordline can form a corresponding LSB or MSB page. As illustrated, Page-0 can form an LSB page of WL<0>, Page-2 can from an MSB of WL<0>, Page-1 can form an LSB of WL<1>, etc. As disclosed herein, various values of read reference voltages can be applied to a corresponding wordline in order to determine the corresponding values of data stored within an LSB or MSB page.

As illustrated, a voltage (Vpass) that causes transistors to conduct can be applied to gates of transistors included in WL<N>, WL<2>, and WL<0>. The state of the transistors with Vpass applied is illustrated by diagram 204. Illustrated is an exemplary NAND flash memory which can include a floating gate transistor with a control gate (CG) connected to a wordline and the source and drain connect to neighboring memory cells. Current passing through the source(s) and drain(s) can be induced by a bitline. Thus, a wordline can be defined as being electrically coupled to a gate of a transistor modelling a memory cell and a bitline can be defined as being electrically coupled to a source or drain of the transistor.

An amount of charge stored in the floating gate can determine the threshold voltage of the transistor to cause the transistor to conduct and, thus, the value stored therein. As illustrated in diagram 304, a Vpass can induce a tunnel 310 to form through a substrate between a source and a drain. As illustrated by diagram 306, a reference voltage (e.g., Va, Vb, and Vc) can be applied to a CG of the floating gate (FG). If the reference voltage is sufficient, a tunnel (similar to tunnel 310) can be induced through a substrate and the floating gate can conduct.

An LSB page can be read by inducing a single reference voltage (e.g., Vb) onto a wordline. If the transistors of the wordline conduct, then the corresponding sense amplifiers can determine that the transistors are in a state wherein the data stored by the transistors includes the LSB being set. In a similar fashion, progressively higher reference voltages can be applied to the wordline to determine an MSB page. However, depending on the organization of the memory, two voltages may need to be applied to determine whether an MSB for a transistor is set. For example, a voltage between a ground reference and Vb can be applied and, sequentially, a voltage between Vb and Vpass. Depending on whether the transistor conducts upon application of the various reference voltages, an LSB and MSB for the transistor can be determined.

An electric charge can be injected into a floating gate during read or write operations through Fowler-Nordheim (FN) tunneling effects which can create an electrical tunnel between a floating gate and a corresponding substrate. The FN tunnel can be triggered by an electric field passing through a tunnel and can be proportional to a voltage applied to a CG and an amount of charge stored in the floating gate. As disclosed herein, during a read operation, a voltage can be induced on memory cells other than those being read (for example, memory cells 114-118 and 126-130 when reading memory cells 120-124 as illustrated in FIG. 1B).

FIGS. 1A-3 illustrate embodiments using NAND memory wherein several transistors representing memory cells can be connected in series. For example, a bitline may connect sources and drains between several transistors. A wordline can be coupled to gates of the transistors. In NOR memory, each memory cell may have a drain connected directly to a ground instead of another transistor of a memory cell. NAND memory constructs may result in more dense memory constructs as compared to NOR memory constructs due to reductions in ground wires and/or bit lines.

Figure 4:
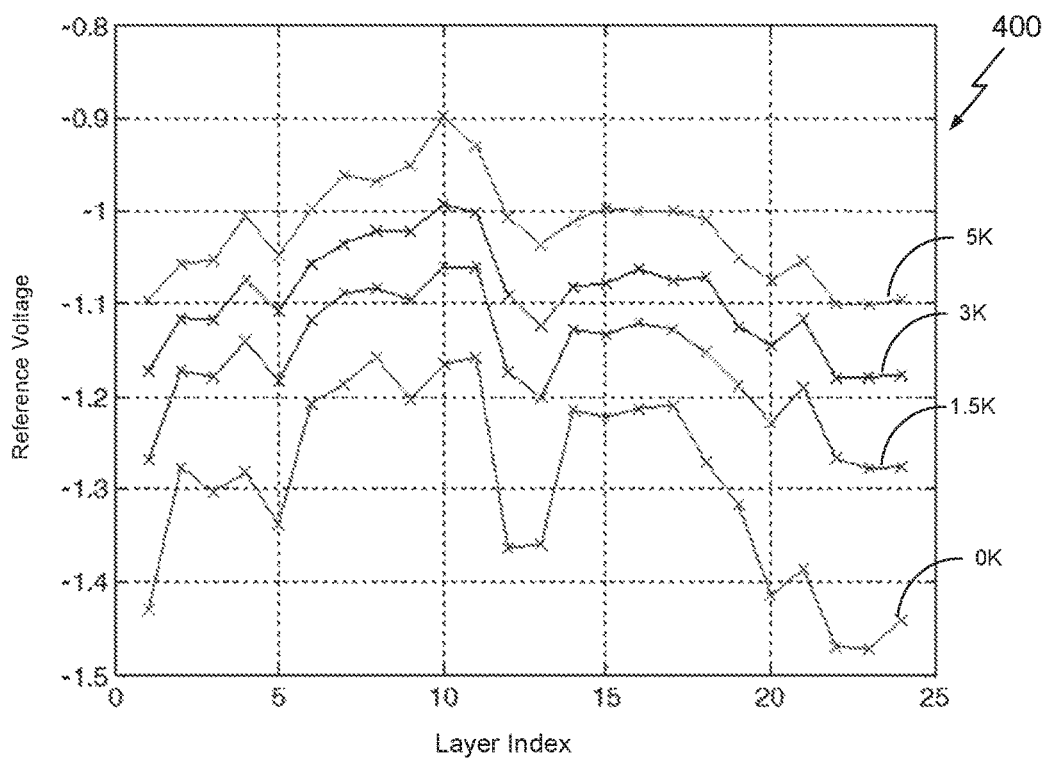
FIG. 4 includes a graph to illustrate features of the disclosure regarding trends between memory layers.

FIG. 4 illustrates a chart 400 illustrating features of the disclosure. As disclosed herein, manufacturing of three-dimensional memory constructs can introduce various physical variations within the construct. Furthermore, as disclosed herein, determining a value of a memory cell or writing a value to a memory cell may include energizing the memory cell with certain voltage(s). The physical inconsistencies introduced by manufacturing three-dimensional memory constructs can impact functionality of reading from or writing to memory cell(s) of a three-dimensional memory construct.

Chart 400 illustrates threshold voltage(s) used to account for such inconsistencies. On the horizontal axis is a layer index of a multi-layer three-dimensional memory construct. On the vertical axis is a reference voltage that can be used as a baseline for reading or writing values to memory cells or as an offset of a voltage, for example. As illustrated, the reference voltages can vary significantly between layers of a three-dimensional memory array. For example, the reference voltage of layer 24, line 0k in this example, can approach −1.5V whereas the reference voltage for layer 10 for the same line can approach −1.15V. Given that many memory devices may operate at a 4.4V threshold or less, such variations can become significant. Using the techniques disclosed herein, these variations can be accounted for when performing memory operations on three-dimensional solid state memory constructs, improving accuracies of read, write, or other operations.

Furthermore, chart 400 illustrates several different lines, each corresponding to various conditions of the corresponding memory cells. For example, the bottom line is illustrated as corresponding to 0k program erase cycles (PECs). Flash, or other memory cells, can degrade as they are written to (e.g., by a PEC). As the memory cells degrade, voltage(s) required to accurately read from or write to the memory cells can alter. Chart 400 illustrates a particular three-dimensional memory construct characterized as according to the reference voltage required per layer index after various numbers of PECs. As illustrated, the reference voltage trends per layer index can be consistent across layers of a three-dimensional memory construct even as various other conditions of the memory are changed (PECs, for example). Other conditions may include data retention time(s), memory temperature(s), source voltage variations, etc. Using the techniques disclosed herein, a layer index can be used to modify a voltage applied to a memory cell in a three-dimensional memory construct. The voltage can further be modified based on the one or more conditions of the memory cells (such as PECs).

The techniques disclosed herein can include directly mapping a layer index to a reference voltage. However, as illustrated by chart 400, the reference voltages can be grouped into several corresponding voltages. For example, reference voltages −1.2 to −1.4 may be grouped to a value of −1.4. By grouping the voltages in such a manner, the optimal reference voltages per layer and/or other conditions can be clustered. The clustering can be used to minimize controller overhead when determining an optimal reference voltage for a layer index. For example, assuming a one terabyte solid state hard drive with eight kilobyte pages and three pages per layer, storage of reference voltages for each layer of a three-dimensional memory construct could be 400 megabytes of primary memory such as a buffer. The clustering techniques disclosed herein can be used to minimize storage space needed to store reference voltage(s) and/or processor overhead to calculate reference voltage(s).

One example of clustering layer indexes with condition(s) of memory cells is shown in Table 1 below. Table 1 corresponds to chart 400 wherein each line of chart 400 corresponds to a row of table 1. In table 1, each layer index has been clustered into one of three clusters (enumerated 1-3). Each of the clusters can correspond to a discrete reference voltage. Furthermore, as illustrated, as operational conditions change, the cluster that a layer is assigned to can be modified to account for degradation of memory cells disposed in the layer due to the operational conditions, for example.

TABLE 1

Clustering of layer indexes

5K: {1, 1, 1, 2, 1, 2, 3, 3, 3, 3, 3, 2, 2, 2, 2, 2, 2, 2, 1, 1, 1, 1, 1, 1}
3K: {1, 1, 1, 2, 2, 2, 3, 3, 3, 3, 3, 2, 1, 2, 2, 2, 2, 2, 1, 1, 1, 1, 1, 1}
1.5K {1, 2, 2, 2, 2, 3, 3, 3, 3, 3, 3, 2, 2, 2, 2, 3, 2, 2, 2, 1, 2, 1, 1, 1}
0K: {1, 2, 2, 2, 2, 3, 3, 3, 3, 3, 3, 1, 1, 3, 3, 3, 3, 2, 2, 1, 1, 1, 1, 1}

Figure 5:
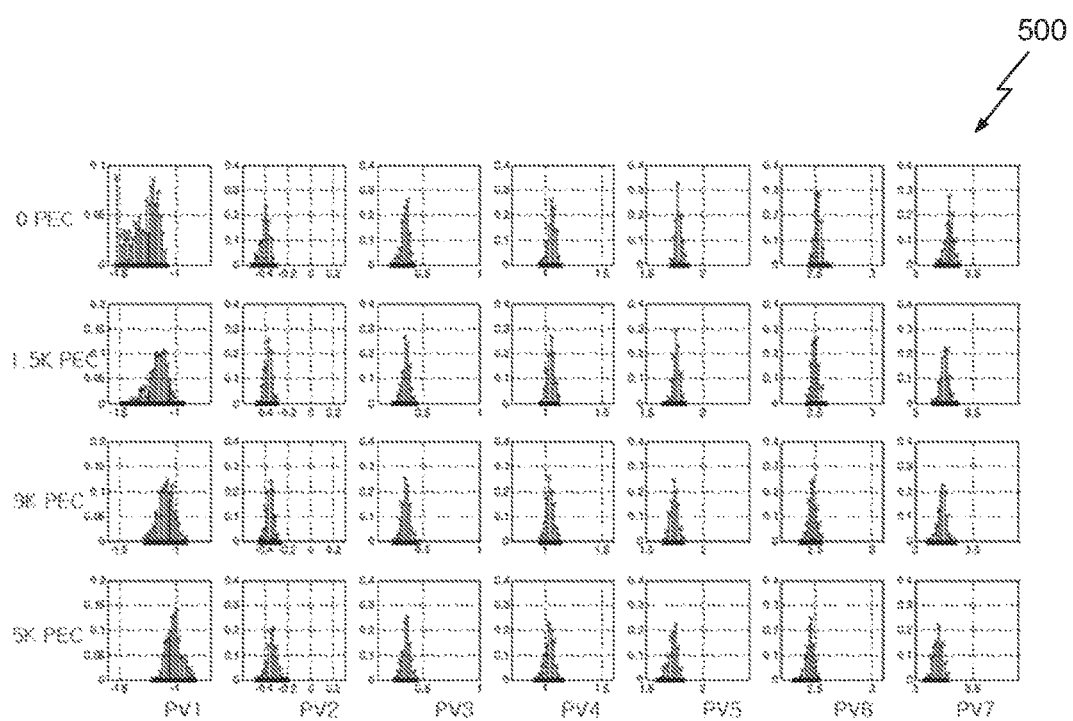
FIG. 5 includes a plurality of graphs to illustrate features of the disclosure regarding trends between memory cells conditions.

FIG. 5 illustrates a collection of charts 500. Each of the charts corresponds to a histogram of reference voltages for various states of memory cells (enumerated PV1 through PV7). Thus, each vertical column of charts 400 represents a common memory state. Each horizontal row of charts 400 represents different operating conditions (0-5k PECs). Each histogram includes reference voltages corresponding to a respective layer index. The vertical axis of each chart represents a percentage of layers corresponding to a reference voltage along the horizontal axis. As illustrated, distributions can vary depending on a state of a memory cell. For example, the distributions for state PV1 vary more than the distributions for state PV7.

The trends of charts 500 can be used to modify or optimize the disclosed clustering techniques. For example, each cluster disclosed herein can correspond to a set of discrete voltages wherein each of the set corresponds to a memory cell state. Furthermore, more reference voltages/ clusters may be assigned to certain memory cell states than others to account for the differences in variations of reference voltages. Also, the various reference voltages/numbers of reference voltages can be modified as various operational conditions of memory cells change.

Using the techniques disclosed herein, error rates of reading memory cell(s) and errors resulting from other operations using three-dimensional memory constructs can be minimized without unduly burdening a corresponding memory controller. As disclosed herein, using the clustering techniques can relieve a memory controller from storing and/or determining an excessive number of reference voltages. Tables 2-4 show results that quantify error rates between several techniques. Table 2 illustrates error rates from determining various bits from a set of memory cells subjected to various PECs using die referenced reference voltages (e.g., a single reference voltage is used for a single memory die). Table 3 illustrates example results using the disclosed techniques using clustered layer referenced reference voltages. As shown, a 40% reduction in error rates can be achieved over die level reference voltages. Table 4 illustrates results from directly mapping a layer index to a corresponding reference voltage. As shown, the error rate differences between table 3 and table 4 are less than 5%. However, the clustering techniques result in less storage and processing overhead, as disclosed herein.

TABLE 2

Raw error rate with die level optimum read reference voltages

| rBER | 0K | | 1.5K | | 3K | | 5K | |
|------|----|----|------|----|----|----|----|----|
| LSB | 0.000345 | 0.000926 | 0.000812 | 0.001969 | 0.001148 | 0.003074 | 0.001472 | 0.007208 |
| CSB | 0.000255 | 0.000886 | 0.000574 | 0.001451 | 0.000871 | 0.004354 | 0.001411 | 0.009300 |
| MSB | 0.000217 | 0.001538 | 0.000595 | 0.005312 | 0.001277 | 0.014636 | 0.003079 | 0.027741 |

TABLE 3

Raw error rates using clustered read reference voltages

| rBER | 0K | | 1.5K | | 3K | | 5K | |
|------|------|------|------|------|------|------|------|------|
| LSB | 0.000331 | 0.000913 | 0.000792 | 0.001671 | 0.001124 | 0.002706 | 0.001436 | 0.003814 |
| CSB | 0.000243 | 0.000886 | 0.000554 | 0.001304 | 0.000831 | 0.003517 | 0.001319 | 0.007279 |
| MSB | 0.000199 | 0.001122 | 0.000531 | 0.004159 | 0.001092 | 0.010835 | 0.002627 | 0.020766 |

TABLE 4

Raw error rates using direct mapping between read reference voltage and layer index

| rBER | 0K | | 1.5K | | 3K | | 5K | |
|------|------|------|------|------|------|------|------|------|
| LSB | 0.000277 | 0.000820 | 0.000668 | 0.001290 | 0.000920 | 0.001957 | 0.001162 | 0.003118 |
| CSB | 0.000197 | 0.000731 | 0.000451 | 0.001208 | 0.000674 | 0.003092 | 0.001023 | 0.007028 |
| MSB | 0.000166 | 0.001109 | 0.000449 | 0.003802 | 0.000947 | 0.010807 | 0.002283 | 0.019617 |

Figure 6:
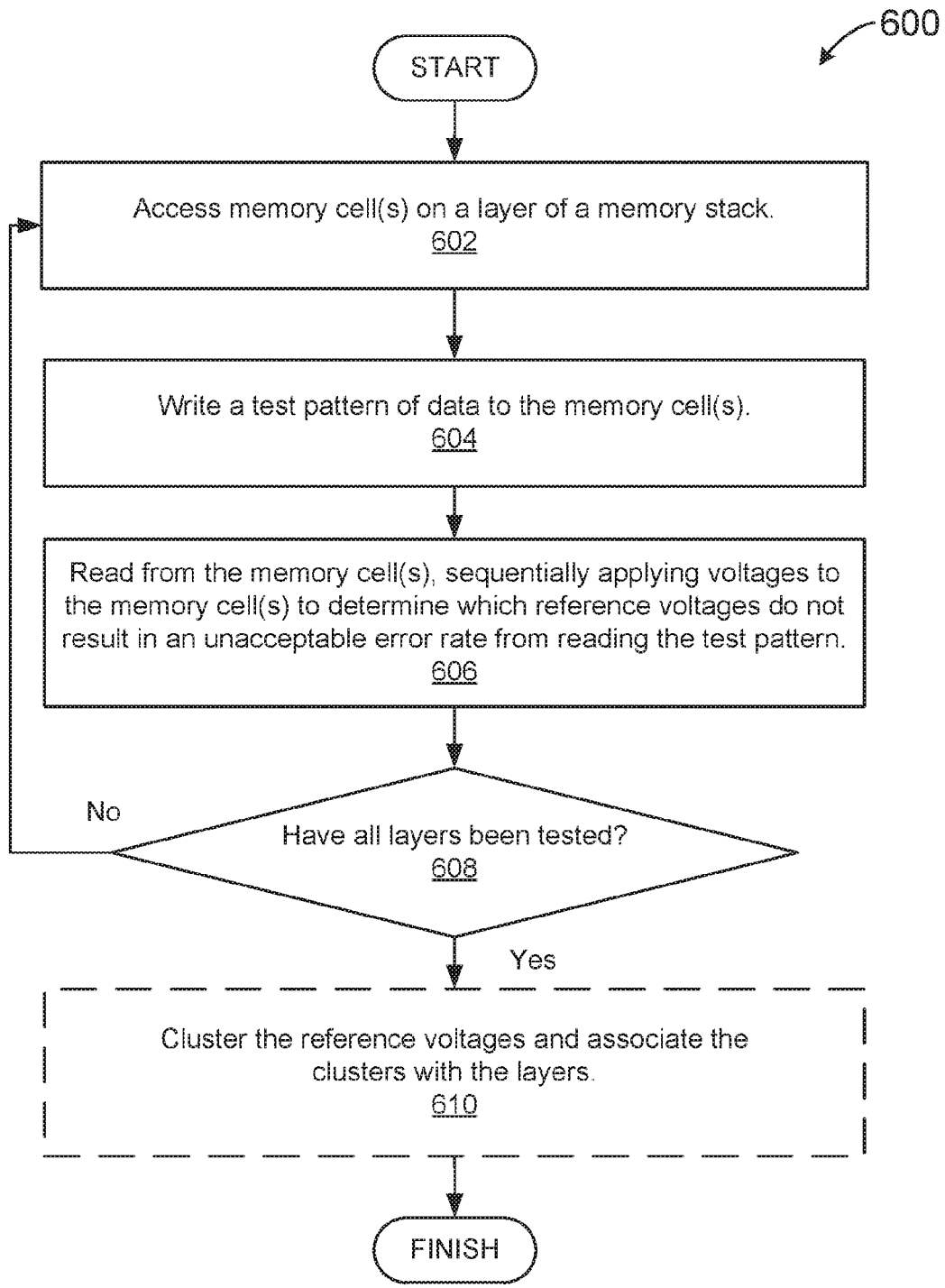
FIG. 6 is a simplified flow chart illustrating operation of a memory controller according to certain embodiments.

FIG. 6 is a simplified flow chart 600 illustrating a method to generate reference voltages according to certain embodiments of the disclosure. The techniques of flow chart 600 can be implemented by controller 202, for example. The techniques of flow chart 600 can be initiated upon initial startup of a solid state hard drive or other memory device, for example. At 602, a controller can access one or more memory cells on a layer of a three-dimensional memory stack. The memory cell(s) can use the control lines disclosed herein (e.g., bitlines, wordlines, select lines, etc.). As disclosed herein, a trend can be observed in certain three-dimensional memory constructs wherein memory cells within a same layer respond similarly to applied voltage(s). Thus, a subset of memory cells may be selected for a layer. At 604, a test pattern of data can be written to the one or more memory cells in the layer.

At 606, the memory cells can be read and the data therein verified against the test pattern. As disclosed herein, one or more reference voltages may be applied to the one or more memory cells to read data contained therein. These reference voltages may be selected by a controller and incremented in order to determine threshold reference voltages that have a high probability of not resulting in an unacceptably high error rate when reading from the one or more memory cells for the layer. For example, the threshold voltage may be incremented (or decremented) for various memory cells within a layer until an error (or an unacceptably high error rate) is determined through use of the test data pattern. An average of the voltage ranges applied to the memory cells that eventually resulted in an error (or an unacceptably high error rate) can be used as a reference voltage for the memory cells, if, for example, clustering is used. Otherwise, the a voltage range can be used itself. At 608, a determination can be made if all layers of the memory have been tested. If not, the method can proceed to 602 and subsequent until all layers are tested.

At 610, if all layers have been tested, then, optionally, clustering can be performed to cluster the layers and/or reference voltages. As disclosed herein, the clustering can result in a many-to-one relationship (e.g., between layers and reference voltages). The reference voltages can be stored such that later operations involving the one or more memory cells can use the reference voltages. Also as disclosed herein, memory constructs can be layer addressable by wordline. Thus, the many-to-one relationship can exist for clustering of wordlines (which may correspond to respective layers). The method of flow chart 600 is but one example method using techniques of the disclosure. It should be understood that various other write, read, or other operations can be performed using techniques of the disclosure. Furthermore, it should be understood that the method of flow chart 600 may be performed at manufacture, prior to a tested memory die being integrated with a controller. For example, the memory die may be encoded with reference voltage information that a controller can later read and determine the reference voltages accordingly. Furthermore, the reference voltages can be offset and/or adjusted based on one or more memory cell conditions, as disclosed herein. For example, the method of flow chart 600 may be performed upon initial powering of a memory device and the reference voltages recorded. As the memory is written to through various PECs, for example, the reference voltages can be adjusted.

Figure 7:
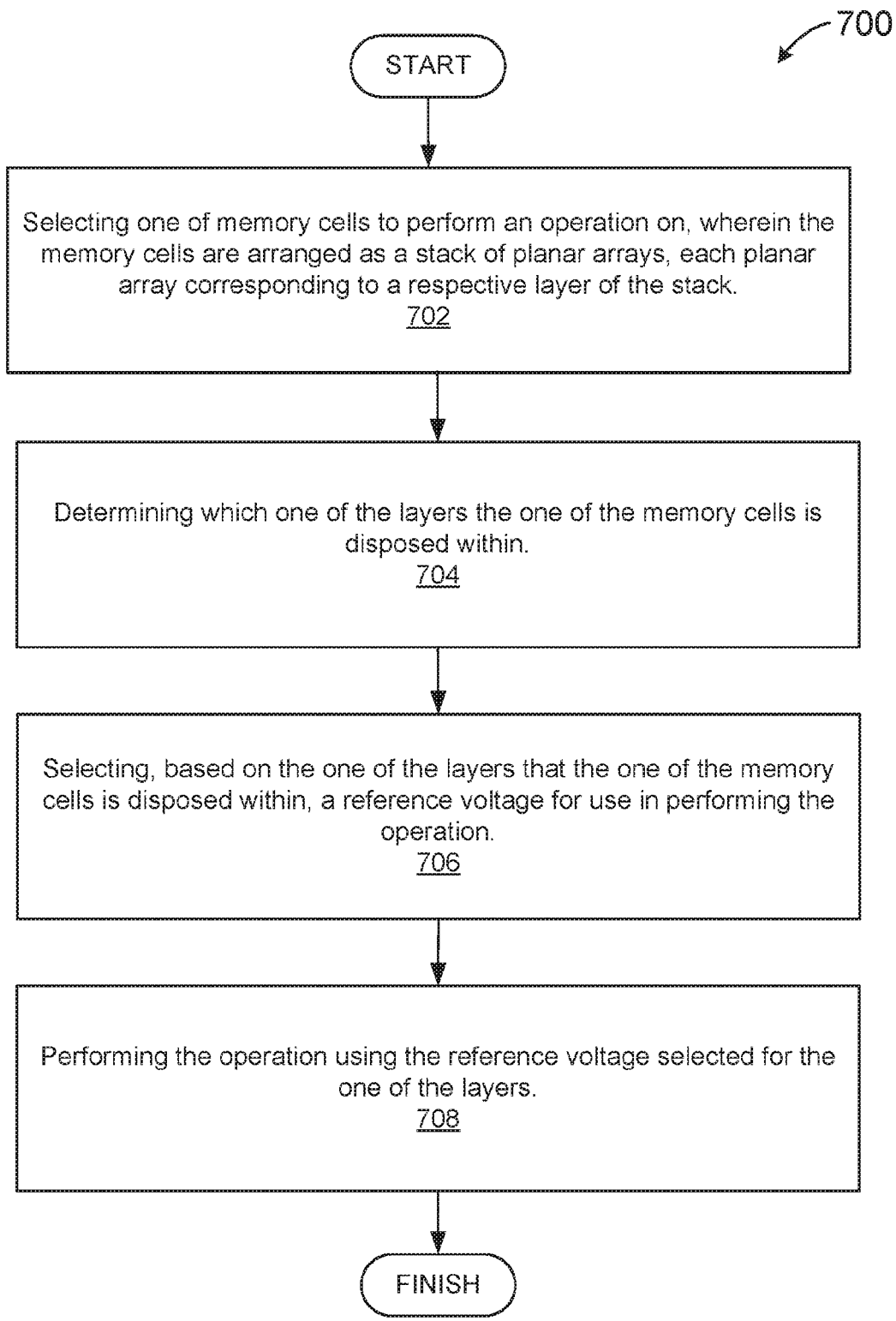
FIG. 7 is a simplified flow chart illustrating several features of the disclosure.

FIG. 7 is a simplified flow chart 700 illustrating techniques of the disclosure. The techniques of flow chart 700 can be performed by controller 202, for example. At 702, one of memory cells can be selected to perform an operation upon. The memory cells can be arranged as a stack of planar arrays, each planar array corresponding to a respective layer of the stack. As disclosed herein, the operation can be a read, write, or other operation. At 704, one of the layers that the one of the memory cells is disposed within can be determined. The layer can be determined by determining control line(s) necessary to access the one or memory cells, a mapping between a memory address and a layer, or other. At 706, based on the one of the layers that the one of the memory cells is disposed within, a reference voltage can be selected for use in performing the operation. The reference voltage can be an absolute reference voltage or an offset. The reference voltage can be determined based on a lookup table, via a transformation, or other. As disclosed herein, the reference voltage can be determined for a layer by clustering several layers together and assigning a reference voltage to the clustered layers. At 708, the operation can be performed using the reference voltage selected from the one of the layers. The operation can be a read, write, or other operation, as disclosed herein. The memory cells can be flash or other types of memory cells.

Figure 8:
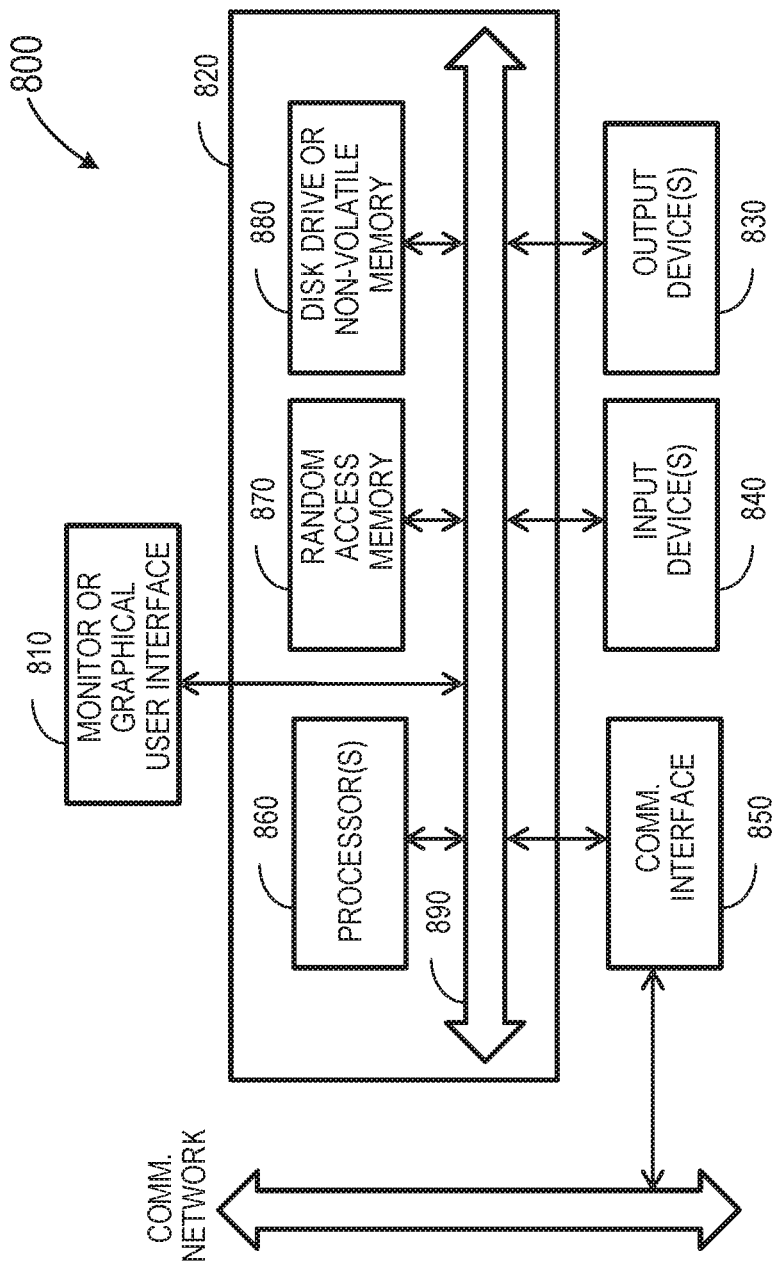
FIG. 8 is a simplified block diagram illustrating an apparatus that may be used to implement various embodiments according to the present invention.

FIG. 8 is a simplified block diagram illustrating an apparatus that may be used to implement various embodiments according to the present invention. FIG. 8 is merely illustrative of an embodiment incorporating the present invention and does not limit the scope of the invention as recited in the claims. One of ordinary skill in the art would recognize other variations, modifications, and alternatives. In one embodiment, computer system 800 typically includes a monitor 810, a computer 820, user output devices 840, user input devices 840, communications interface 850, and the like.

As shown in FIG. 8, computer 820 may include a processor(s) 860 that communicates with a number of peripheral devices via a bus subsystem 890. These peripheral devices may include user output devices 840, user input devices 840, communications interface 850, and a storage subsystem, such as random access memory (RAM) 870 and disk drive 880.

User input devices 840 can include all possible types of devices and mechanisms for inputting information to computer system 820. These may include a keyboard, a keypad, a touch screen incorporated into the display, audio input devices such as voice recognition systems, microphones, and other types of input devices. In various embodiments, user input devices 840 are typically embodied as a computer mouse, a trackball, a track pad, a joystick, wireless remote, drawing tablet, voice command system, eye tracking system, and the like. User input devices 840 typically allow a user to select objects, icons, text and the like that appear on the monitor 810 via a command such as a click of a button or the like.

User output devices 840 include all possible types of devices and mechanisms for outputting information from computer 820. These may include a display (e.g., monitor 810), non-visual displays such as audio output devices, etc.

Communications interface 850 provides an interface to other communication networks and devices. Communications interface 850 may serve as an interface for receiving data from and transmitting data to other systems. Embodiments of communications interface 850 typically include an Ethernet card, a modem (telephone, satellite, cable, ISDN), (asynchronous) digital subscriber line (DSL) unit, FireWire interface, USB interface, and the like. For example, communications interface 850 may be coupled to a computer network, to a FireWire bus, or the like. In other embodiments, communications interfaces 850 may be physically integrated on the motherboard of computer 820, and may be a software program, such as soft DSL, or the like.

In various embodiments, computer system 800 may also include software that enables communications over a network such as the HTTP, TCP/IP, RTP/RTSP protocols, and the like.

In alternative embodiments of the present invention, other communications software and transfer protocols may also be used, for example IPX, UDP or the like. In some embodiments, computer 820 includes one or more Xeon microprocessors from Intel as processor(s) 860. Further, one embodiment, computer 820 includes a UNIX-based operating system.

RAM 870 and disk drive 880 are examples of tangible storage media configured to store data such as embodiments of the present invention, including executable computer code, human readable code, or the like. Other types of tangible storage media include floppy disks, removable hard disks, optical storage media such as CD-ROMS, DVDs and bar codes, semiconductor memories such as flash memories, read-only-memories (ROMS), battery-backed volatile memories, networked storage devices, and the like. RAM 870 and disk drive 880 may be configured to store the basic programming and data constructs that provide the functionality of the present invention.

Software code modules and instructions that provide the functionality of the present invention may be stored in RAM 870 and disk drive 880. These software modules may be executed by processor(s) 860. RAM 870 and disk drive 880 may also provide a repository for storing data used in accordance with the present invention.

RAM 870 and disk drive 880 may include a number of memories including a main random access memory (RAM) for storage of instructions and data during program execution and a read only memory (ROM) in which fixed non-transitory instructions are stored. RAM 870 and disk drive 880 may include a file storage subsystem providing persistent (non-volatile) storage for program and data files. RAM 870 and disk drive 880 may also include removable storage systems, such as removable flash memory.

Bus subsystem 890 provides a mechanism for letting the various components and subsystems of computer 820 communicate with each other as intended. Although bus subsystem 890 is shown schematically as a single bus, alternative embodiments of the bus subsystem may utilize multiple busses.

FIG. 8 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc.; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A device, comprising:
   memory comprising planar arrays of memory cells, wherein the planar arrays are arranged in stacked layers, each layer comprising a respective one of the planar arrays; and
   a controller coupled to the memory, the controller configured to:
      select a memory cell to perform an operation on;
      determine a layer from a plurality of layers that the memory cell is disposed within;
      select, based on the layer that the memory cell is disposed within, a cluster from a plurality of clusters that the layer belongs to, wherein each cluster comprises a different subset of the plurality of layers, and the subset of the plurality of layers for each respective cluster has a distribution of reference voltages with a mean reference voltage, the mean reference voltage lying outside of a distribution of reference voltages for other clusters;
      select a reference voltage included in the distribution of reference voltages for the selected cluster based on a condition of the memory cell; and
      perform the operation using the reference voltage selected.

2. The device of claim 1, wherein the controller is configured to select the reference voltage from one of several discrete reference voltages stored on the device.

3. The device of claim 2, wherein the several discrete voltages are one of several groups of discrete voltages, each of the groups of discrete voltages corresponding to a respective one of groups of the memory cells.

4. The device of claim 3, wherein each of the groups of memory cells includes memory cells within a same circuit die.

5. The device of claim 2, wherein each of the several discrete reference voltages corresponds to a subset of the layers.

6. The device of claim 1, wherein the operation is a read operation; and
   wherein performing the read operation includes:
      comparing a voltage read from the memory cell to a threshold voltage based on the reference voltage; or
      applying, based on the reference voltage, a voltage to the memory cell to read a value stored therein.

7. The device of claim 6, wherein:
   the reference voltage is selected from the distribution of reference voltages of the cluster based on the condition including at least one of a retention time of data stored within the one of the memory cells or a number of program erase cycles that the one of the memory cells has been subjected to; and
   wherein performing the operation further comprises applying the reference voltage selected from the distribution of reference voltages of the cluster to the memory cell to read the value stored therein.

8. The device of claim 1, wherein the operation is a write operation; and
   wherein performing the write operation includes selecting a voltage to write to the one of the memory cells based on the reference voltage.

9. The device of claim 1, wherein each of the layers corresponds to a respective wordline; and
   the one of the layers is determined based on the wordline that the one of the memory cells corresponds to.

10. The device of claim 1, wherein the condition include at least one of a retention time of data stored within the one of the memory cells or a number of program erase cycles that the one of the memory cells has been subjected to, and wherein performing the operation comprises applying the reference voltage selected from the distribution of reference voltages of the cluster to the memory cell.

11. The device of claim 1, wherein the controller is further configured to:
    select the reference voltage from a set of one or more discrete reference voltages, the set selected from several sets based on the condition; and
    modify a reference voltage in response to a change of operational conditions of the memory cells.

12. The device of claim 1, wherein the memory cells are flash memory cells.

13. The device of claim 1, wherein the plurality of layers are manufactured using deposition techniques wherein each of the plurality of layers is deposited sequentially.

14. The device of claim 1, wherein the memory cells are each configured to store three or more discrete states, each of the three or more discrete states corresponding to a value stored by the corresponding memory cell.

15. The device of claim 14, wherein the operation is a read operation to determine if the memory cell is in one of three or more discrete states; and
    the controller is configured to select the reference voltage from one of several discrete reference voltages based upon the one of the three or more discrete states.

16. The device of claim 1, wherein the planar arrays of memory cells are NAND memory cells.

17. A method, comprising:
    selecting one of memory cells to perform an operation on, wherein the memory cells are arranged as a stack of planar arrays, each planar array corresponding to a respective layer of the stack;
    determining a layer of the plurality of layers the one of the memory cells is disposed within;
    selecting, based on the layer that the one of the memory cells is disposed within, a cluster from a plurality of clusters that the layer belongs to, wherein each cluster comprises a different subset of the plurality of layers, and the subset of the plurality of layers for each respective cluster has a distribution of reference voltages with a mean reference voltage, the mean reference voltage lying outside of a distribution of reference voltages for other clusters;
    selecting a reference voltage included in the distribution of reference voltages for the selected cluster based on a condition of the one of the memory cells; and
    performing the operation using the reference voltage selected.

18. A non-transitory computer readable media storing instructions that, when executed by one more processors, cause the one or more processors to:
- select one of memory cells to perform an operation on, wherein the memory cells are arranged as a stack of planar arrays, each planar array corresponding to a respective layer of the stack;
- determine a layer of the plurality of layers the one of the memory cells is disposed within;
- select, based on the layer that the one of the memory cells is disposed within, a cluster from a plurality of clusters that the layer belongs to, wherein each cluster comprises a different subset of the plurality of layers, and the subset of the plurality of layers for each respective cluster has a distribution of reference voltages with a mean reference voltage, the mean reference voltage lying outside of a distribution of reference voltages for other clusters;
- select a reference voltage included in the distribution of reference voltages for the selected cluster based on a condition of the one of the memory cells; and
- perform the operation using the reference voltage selected.

19. The non-transitory computer readable media of claim 18, wherein the memory cells are flash memory cells.

20. The device of claim 1, wherein the controller is configured to modify an assignment of layers to clusters in response to a degradation of memory cells disposed in the layer due to operational conditions.

* * * * *